United States Patent
Suzuki et al.

(10) Patent No.: US 6,518,887 B2
(45) Date of Patent: Feb. 11, 2003

(54) INFORMATION RECORDING TAG

(75) Inventors: Kazuaki Suzuki, Kanuma (JP); Takashi Matsumura, Kanuma (JP)

(73) Assignee: Sony Chemicals Corp., Tokyo (JP)

( * ) Notice: Subject to any disclaimer, the term of this patent is extended or adjusted under 35 U.S.C. 154(b) by 0 days.

(21) Appl. No.: 09/794,099

(22) Filed: Feb. 28, 2001

(65) Prior Publication Data

US 2001/0020895 A1 Sep. 13, 2001

(30) Foreign Application Priority Data

Mar. 9, 2000 (JP) ........................................ 2000-065805

(51) Int. Cl.$^7$ .............................................. G08B 13/14
(52) U.S. Cl. .............................. 340/572.8; 340/572.1; 340/572.3; 340/572.5
(58) Field of Search ........................... 340/572.8, 572.1, 340/572.3, 572.5, 572.7, 568.1, 571

(56) References Cited

U.S. PATENT DOCUMENTS

| | | | | |
|---|---|---|---|---|
| 4,063,229 A | * | 12/1977 | Welsh et al. | 340/571 |
| 5,574,470 A | * | 11/1996 | De Vall | 343/895 |
| 5,635,917 A | | 6/1997 | Todman | |
| 5,767,772 A | * | 6/1998 | Lemaire et al. | 340/571 |
| 5,912,622 A | * | 6/1999 | Endo et al. | 340/572.5 |
| 6,018,298 A | * | 1/2000 | Endo et al. | 340/572.5 |
| 6,133,834 A | * | 10/2000 | Eberth et al. | 340/572.5 |
| 6,147,662 A | * | 11/2000 | Grabau et al. | 343/895 |
| 6,229,444 B1 | * | 5/2001 | Endo et al. | 340/572.6 |
| 6,262,692 B1 | * | 7/2001 | Babb | 343/895 |

FOREIGN PATENT DOCUMENTS

| | | |
|---|---|---|
| EP | 0670563 | 9/1995 |
| EP | 1120739 | 8/2001 |

* cited by examiner

*Primary Examiner*—Toan Pham
(74) *Attorney, Agent, or Firm*—Oliff & Berridge, PLC

(57) ABSTRACT

The information recording tag includes an IC module in which an IC chip and a resonance circuit which is composed of a film capacitor and of an antenna coil are packaged on a substrate, and an adhesive that is applied to the IC module in order to adhere said IC module to an adherend S. The adhesive force between the adhesive and the adherend S is greater than the adhesive force between the insulation film of the film capacitor and the film type electrodes. The information recording tag, that is affixed to a prescribed adherend and used, can be destroyed if an attempt is made to remove it from its adherend after the information recording tag has been affixed to an adherend, in order to prevent improper usage of the information recording tag.

8 Claims, 4 Drawing Sheets x - x Cross-sectional view x - x Cross-sectional view x - x Cross-sectional view x - x Cross-sectional view

INFORMATION RECORDING TAG

BACKGROUND OF THE INVENTION

1. Field of the Invention

The present invention relates to an information recording tag having a built-in IC module, which is affixed to an adherend and which is utilized to record the product data and the like of the adherend.

2. Description of the Related Art

For a variety of products, information recording tags are available, which incorporate an IC module and which are utilized by affixing them to a prescribed product as a tag to record all kinds of information such as the manufacturer, product name, year/month/day of manufacture, specifications, and current usage frequency.

As illustrated in FIGS. 6A and 6B, an information recording tag 10 such as this is typically constituted by packaging a resonance circuit composed of an antenna coil 2 and film capacitor 5 and an IC chip 3 onto a substrate 1 composed of insulation film, sealing it with a sealing resin 11 composed of a thermosetting resin such as an epoxy resin and the like or hot melting resin such as polyester and the like, providing an outer layer film 13 made of a polyester film and the like onto the surface of the recording tag on the side of the substrate 1 with an adhesive 12 such as acrylic based resin or the like interposed therebetween, and providing a release paper 15 onto the surface of the recording tag 1 on the opposite side with an adhesive 14 interposed therebetween. This release paper 15 is removed when the information recording tag 10 is affixed as a tag to a prescribed product that becomes the adherend, and the IC module that has been sealed with resin is affixed to the prescribed adherend using the adhesive 14. The prescribed indications of the product or the like are provided on the outer layer film 13.

In order to prevent such improper usage of a information recording tag that the information recording tag may have been removed improperly and used on products that are different from the products to which it should originally have been affixed, it is preferable for the actual information recording tag to be destroyed if it is improperly detached after it has been affixed to an adherend.

SUMMARY OF THE INVENTION

The present invention is intended to solve the problems in the prior art such as those mentioned above. Thus, it is an object of the present invention to ensure that a film capacitor incorporated in an information recording tag, or a resonance circuit comprising the film capacitor is easily destroyed when an attempt is made to remove the information recording tag from an adherend after it has been affixed to the prescribed adherend, and to prevent improper usage of an information tag.

The inventors perfected the present invention by finding that a film capacitor, or a resonance circuit in which the film capacitor is utilized, may be easily destroyed if an adhesive is applied directly to an IC module without sealing an IC module that is incorporated in an information recording tag with a sealing resin and, in addition, if the adhesive force between the adhesive and the adherend when the IC module is affixed to an adherend is made greater in comparison to the adhesive force between the insulation film of the film capacitor and the film type electrode.

That is to say, the present invention provides an information recording tag comprising an IC module in which an IC chip and a resonance circuit composed of a film capacitor and of an antenna coil are packaged on a substrate, and an adhesive that is applied to the IC module in order to affix said IC module onto an adherend, wherein the adhesive is adhered to film type electrodes of the film capacitor and that the adhesive force between the adhesive and the adherend is greater than the adhesive force between the insulation film of the film capacitor and the film type electrodes.

DETAILED DESCRIPTION OF THE INVENTION

The present invention will be explained in detail below while referring to drawings. Moreover, identical reference numbers will indicate identical or similar structural elements in each drawing.

Figure 1A:
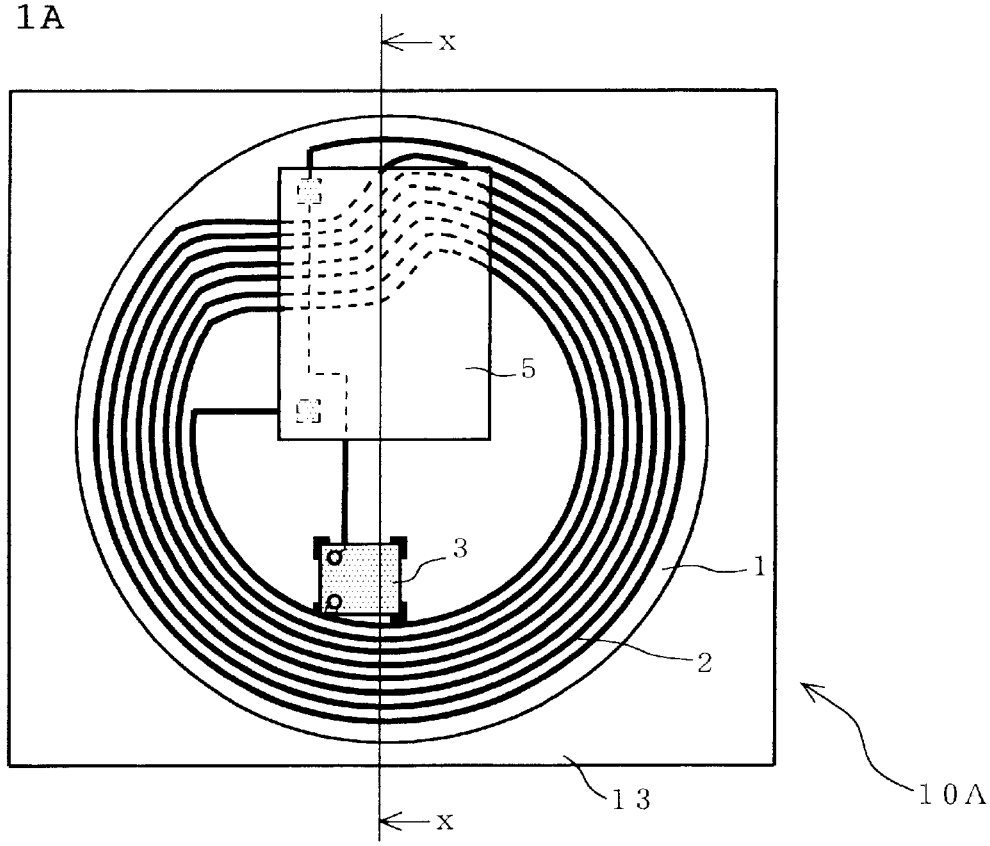
FIGS. 1A and 1B, respectively, are a plane view and a cross-sectional view of the information recording tag of the present invention.
Figure 1B:
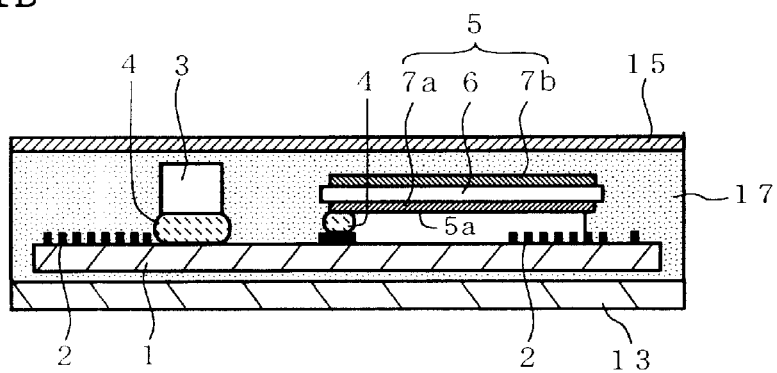

FIGS. 1A and 1B, respectively, are a plane view and a cross-section view of an information recording tag 10A of the present invention on which, by being affixed to an ink ribbon, video film, and other types of products, their product information are recorded.

This information recording tag 10A is a device in which an antenna coil 2, an IC chip 3 and a film capacitor 5 are packaged on a substrate 1 composed of PET, polyimide and other insulation films to form an IC module. A release paper 15 is laminated to the IC module on the side of the film capacitor 5 by means of an adhesive 17 also serving as a filler material, and an outer layer film 13 such as polyester film is laminated to the IC module on the opposite side by means of an adhesive 17. This release film 15 is made such that when the information recording tag 10A is affixed to the prescribed adherend, said release coated film 15 is removed so that the IC module is affixed to the adherend by means of the adhesive 17.

Figure 3A:
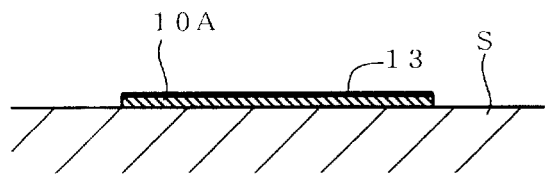
FIGS. 3A to 3C are diagrams for illustrating an operation for preventing improper usage of the information recording tag of the present invention.
Figure 3B:
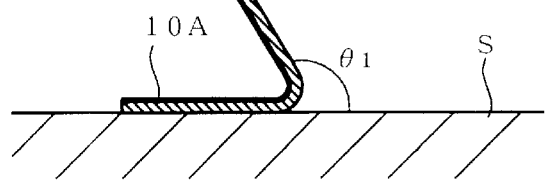
Figure 3C:
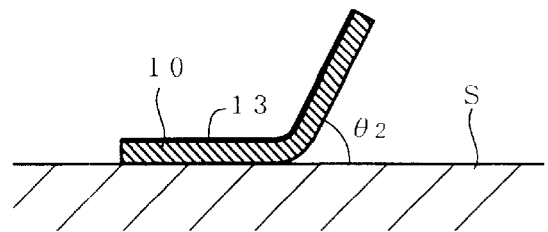
Figure 6A:
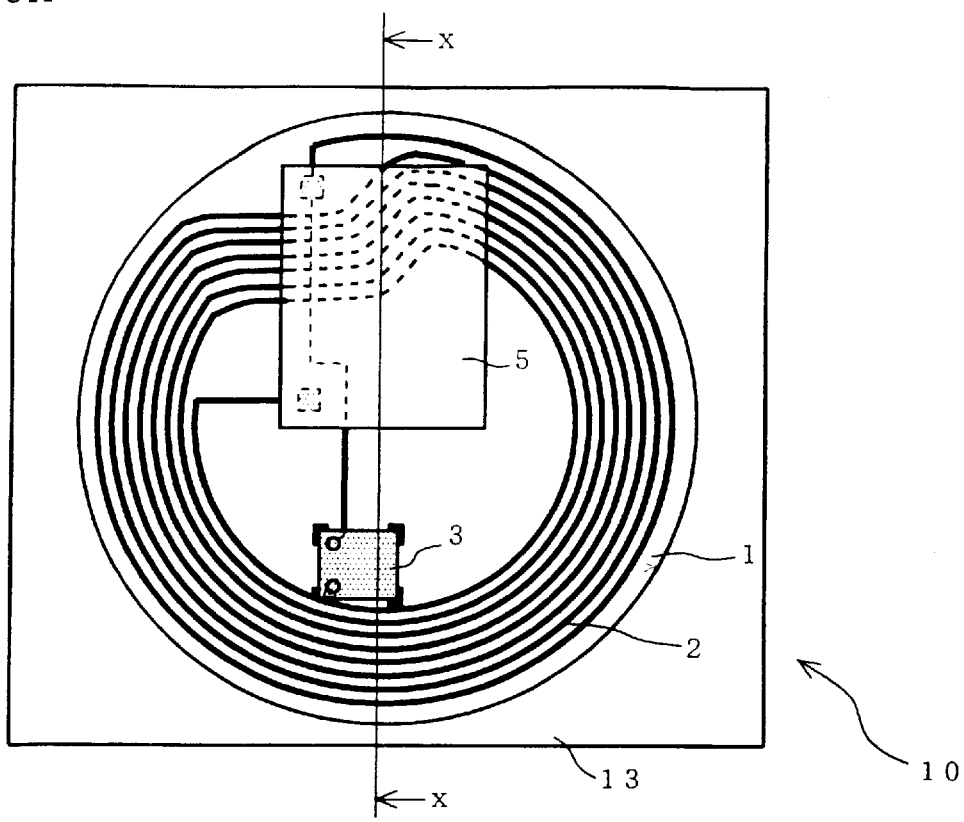
FIGS. 6A and 6B, respectively, are a plane view and a cross-sectional view of a conventional information recording tag.
Figure 6B:
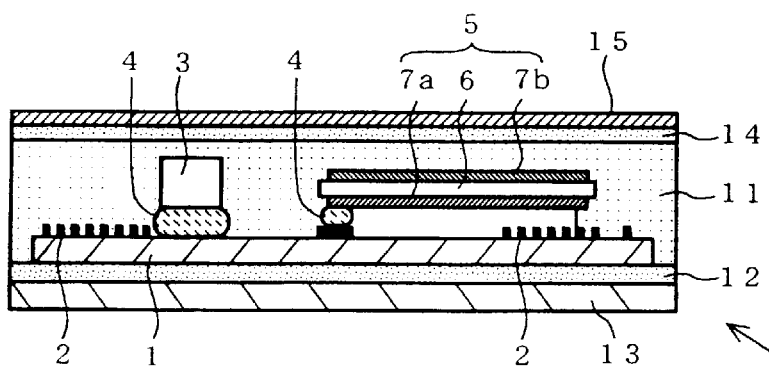

With this information recording tag 10A, an adhesive 17 is adhered directly to the film type electrode 7b of the film capacitor 5, without the IC module being sealed with a sealing resin 11, and also without a spacer material being applied on the IC module, differently from the conventional information recording tag 10 illustrated in FIGS. 6A and 6B. Therefore, the information recording tag 10A according to the present invention can be made thinner with a thickness of about one half of that of the information recording tag 10 in FIGS. 6A and 6B. For this reason, when the information recording tag 10a is affixed to the adherend S with the outer layer film 13 side put outside as illustrated in FIG. 3A, and then it is removed as illustrated in FIG. 3B, the angle of detachment θ1 is larger in comparison to the angle of detachment θ2 when the conventional information recording tag 10 with a greater thickness is removed, as illustrated in FIG. 3c. As a consequence, in this information recording tag 10A, a large load is borne by the IC module at the time it is removed from the adherend S and the IC module is more easily destroyed. Improper usage can thus be prevented.

Figure 2:
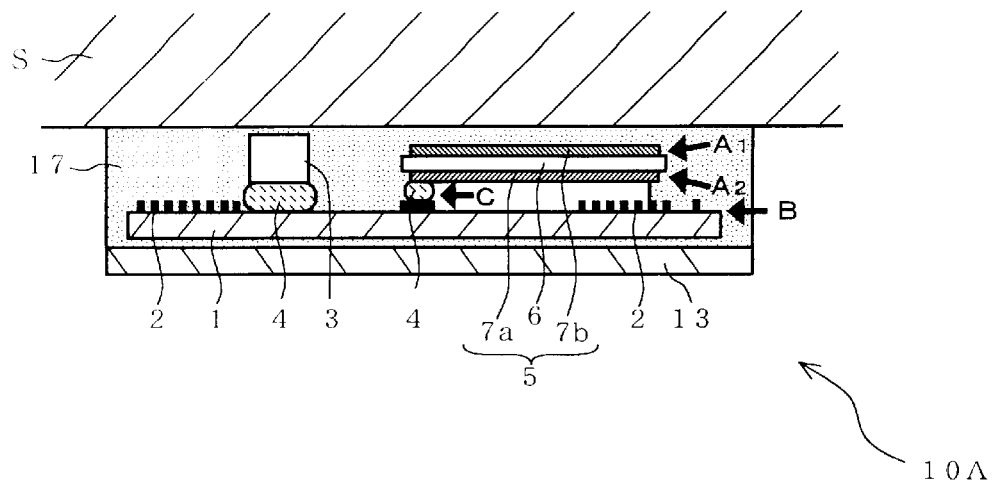
FIG. 2 is a diagram for illustrating an operation for preventing improper usage of the information recording tag of the present invention.

Moreover, with this information recording tag 10A, the adhesive force between the adhesive 17 and the adherend S is greater than the adhesive force between the insulation film 6 of the film capacitor 5 and the film type electrodes 7a and 7b. Consequently, when the information recording tag 10A is removed after it has been affixed to the adherend S, as shown by Arrows A1 and A2 in FIG. 2, the film capacitor 5 will be easily destroyed, starting from the bonding interfaces between the insulation film 6 and the film type electrodes 7a and 7b of the film capacitor 5.

With this information recording tag 10A, the adhesive force between the adhesive 17 and the adherend S is greater than the adhesive force between adhesive 17 and the substrate 1. Consequently, when the information recording tag 10A is removed after it has been affixed to the adherend S the breakage of the resonance circuit is also caused from the bonding interfaces between the adhesive 17 and the substrate 1, as indicated by Arrow B in FIG. 2. Improper usage of the information recording tag can thus be prevented with greater certainty.

Adhesives that can be used as the adhesive 17 whose adhesive force with the adherend S is greater than the adhesive force between the insulation film 6 and the film type electrodes 7a and 7b, and is even greater than the adhesive force between the adhesive 17 and the substrate 1 are, also dependent on such factors as the surface material and condition of the surface of the adherend S, acrylic adhesives, UV setting adhesives and the like, if an ABC resin for example is to be used for the adherend S. By using such adhesives, the adhesive force between the adhesive 17 and the adherend S can be set to between 700 and 1000 g/cm.

Though the adhesive force between the insulation film 6 and film electrodes 7a and 7b of the film capacitor 5 is dependent on such factors as the material used to form them, it will typically be about 800 g/cm or greater in an instance for example where the insulation film 6 is composed of polyimide film and the film type electrodes 7a and 7b are composed of copper foil, and it will be between 1 and 10 g/cm in an instance where the insulation film 6 is composed of mica film and the film type electrodes 7a and 7b are composed of copper foil. Also, while the adhesive force between the adhesive 17 and the film type electrodes 7a and 7b will be dependent on such factors as the material used to form them, it is typically between 700 and 1000 g/cm.

Consequently, the adhesive force between the adhesive 17 and the adherend S can be made greater than the adhesive force between the insulation film 6 and the film type electrodes 7a and 7b by making an appropriate selection of an adhesive 17. Also, the adhesive force between the adhesive 17 and the adherend S can be made greater than the adhesive force between the adhesive 17 and the substrate 1, and the adhesive force between the adhesive 17 and the adherend S can be made greater than the adhesive force between the adhesive 17 and the film type electrodes 7a and 7b.

Methods for applying the adhesive 17 onto the IC module include: (i) a method of covering the IC module that has been adhered to the outer layer film 13 with a film type adhesive which has release paper 15 on one side, (ii) a method of applying a liquid adhesive to the release paper 15 and putting the same over the IC module that has been affixed to the outer layer film 13, and (iii) a method of applying a liquid adhesive to the IC module that has been affixed to the outer layer film 13 and covering the release paper 15 over the same. Using method (iii) makes it possible to obtain an information recording tag with an approximately uniform thickness.

On the other hand, in this information recording tag 10A, an antenna coil 2 is formed by etching a copper foil of a laminate constituting the substrate 1, that is composed of an insulation film and the copper foil. The IC chip 3 is packaged onto the substrate 1 face down with an anisotropic conductive adhesive 4.

Various film type capacitors can be used as the film capacitor 5, but it is preferable to use a mica capacitor that utilizes a mica film as the insulation film 6. Mica film has a low water absorption rate, so the usage of a mica capacitor can prevent the resonance frequency of the IC module from being changed due to moisture absorption can be prevented with the use of a mica capacitor. The adhesive force between the mica film 6 and the film type electrodes 7a and 7b on the opposite sides thereof is typically lower than the adhesive force between the insulation film and film type electrodes of the film capacitor, in which a polyimide film or the like is utilized as an insulation film, and is considerably lower in comparison to the adhesive force between the adhesive 17 and the adherend S, so that the destruction of the mica capacitor 5 can be effected with greater certainty by the separation between the mica film 6 and its film type electrodes 7a and 7b if an attempt is made to remove the information recording tag 10A from its adherend S, once it has been affixed to the adherend S.

In this information recording tag 10A, the electrode portion of the film capacitor 5 is connected to the substrate 1 by an anisotropic conductive adhesive 4 while the non-electrode portion of the film capacitor 5 is not adhered to the substrate 1 by an anisotropic conductive adhesive 4. Also, while the peripheral portion of the film capacitor 5 is adherend to the substrate 1 by an adhesive 17, the adhesive 17 is not present on the face 5a in the central portion of the film capacitor 5 which is situated opposite the substrate 1 and the central part of the film capacitor 5 and the substrate 1 are in a non-adhered state. If the film capacitor 5 is adhered to the substrate 1 exclusively by the electrode portion in this manner, the portion of the film capacitor 5 connected to the substrate 1 is easily broken when an attempt is made to remove the information recording tag 10A after it has been affixed to the adherend S, as indicated by Arrow C in FIG. 2, and improper usage of the information recording tag 10A can be prevented with greater certainty.

Figure 4A:
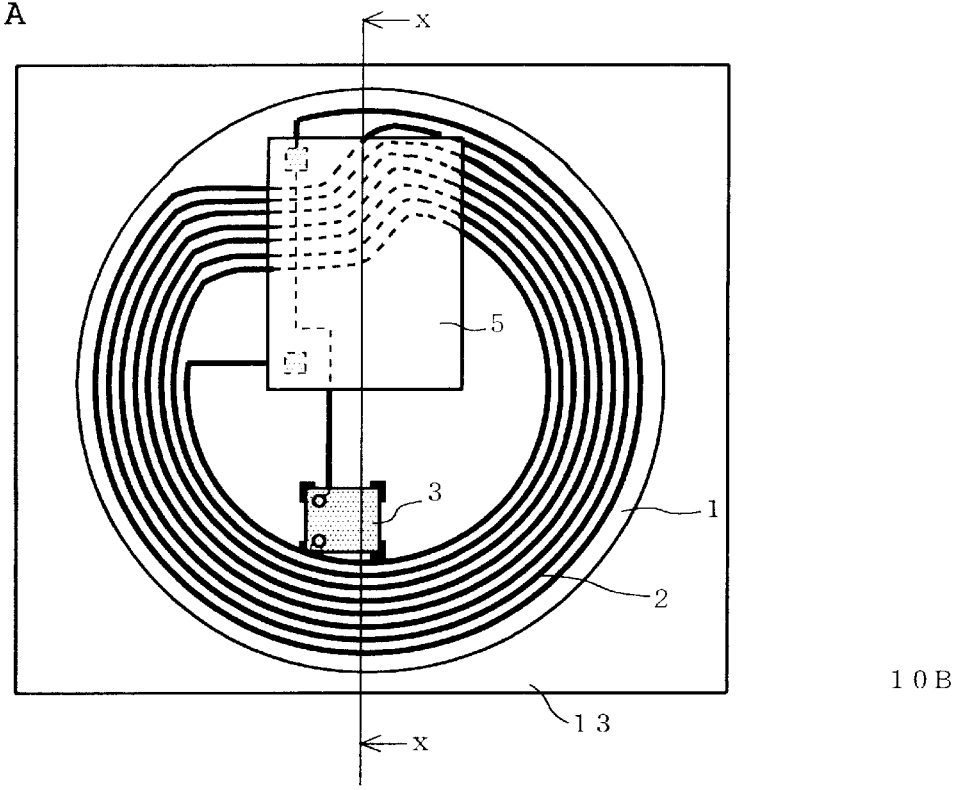
FIGS. 4A and 4B, respectively, are a plane view and a cross-sectional view of the information recording tag of the present invention.
Figure 4B:
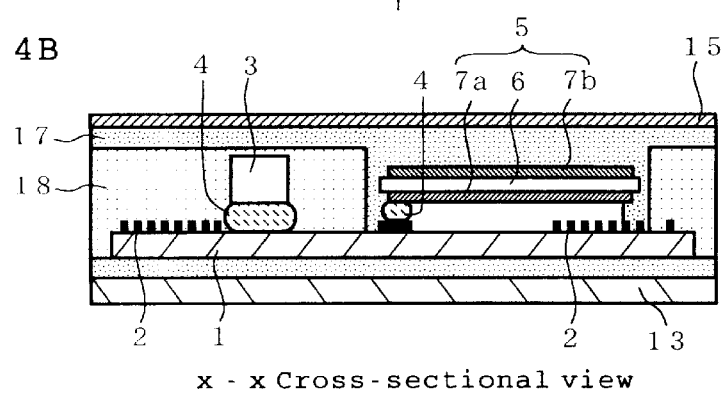

FIGS. 4A and 4B, respectively, are a plane view and a cross-section view of the information recording tag 10B of another embodiment of the present invention.

In this information recording tag 10B, in contrast to the information tag 10A in FIGS. 1A and 1B mentioned above, a spacer material 18 is provided to the periphery of the film capacitor 5 and the adhesive 17 is adhered to the spacer material 18 in the periphery of the film capacitor 5, while constitution in other respects is the same as that of the information recording tag 10A in FIGS. 1A and 1b.

By providing a spacer material 18, it is possible to construct an information recording tag of uniform thickness easily and conveniently. It is preferable to provide the spacer material 18 with perforations and the like as clearance holes and the like for the packaged components such as the IC chip 3 and film capacitor 5.

Figure 5:
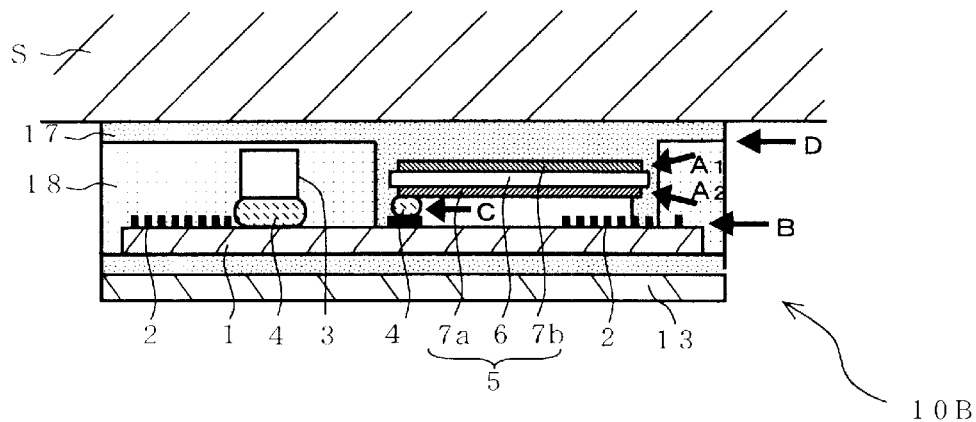
FIG. 5 is a diagram illustrating an operation for preventing improper usage of the information recording tag of the present invention.

Further, it is preferable in situations where a spacer material is provided for the adhesive force between the adhesive 17 and the adherend S to be greater than the adhesive force between the adhesive 17 and the spacer material 18. As a result of this, if the information recording tag 10B is removed after it has been affixed to the adherend S, the information recording tag 10B can be easily destroyed from the bonding interface between the adhesive 17 and the spacer material 18 as indicated by Arrow D in FIG. 5, and in succession, it is possible to cause the film capacitor 5 to be destroyed from the bonding interface between the insulation film 6 and the film type electrodes 7a and 7b of the film capacitor 5, as indicated by Arrows A1 and A2, and further to cause the connecting portion by which the film capacitor 5 is connected to the substrate 1 with an anisotropic conductive adhesive to be broken as indicated by Arrow C.

Further, by making the adhesive force between the adhesive 17 and the spacer material 18 greater than the adhesive force between the spacer material 18 and the substrate 1, destruction of the resonance circuit can be caused easily from the bonding interface between the spacer material 18 and substrate 1, in the same manner as previously described, as shown by Arrow B.

The information recording tag of the present invention can be embodied in various manners without being limited to the examples of the abovementioned information recording tags 10A and 10B. Accordingly, as long as the adhesive 17 on the IC module is adhered to the film type electrodes 7a and 7b of the film capacitor 5 and the adhesive force between the adhesive 17 and the adherend S is greater or smaller with respect to the adhesive force at other locations as described in the above, the type, shape, and arrangement and so on of the antenna coil 2, IC chip 3, and film capacitor 5 that constitute the IC module can be determined as desired.

In the information recording tag of the present invention, improper usage of the information recording tag can be prevented because the film capacitor and/or the resonance circuit surrounding the film capacitor which are incorporated in the information recording tag are easily destroyed if an attempt is made to remove that information recording tag from the adherend after it has been affixed to a prescribed adherend.

The entire disclosure of the specification, Summary, claims and drawings of Japanese Patent Application No. 2000-035805 is hereby incorporated by reference.

What is claimed is:

1. An information recording tag comprising an IC module in which an IC chip and a resonance circuit composed of a film capacitor having a periphery and of an antenna coil are packaged on a substrate, and an adhesive that is applied to the IC module in order to affix said IC module onto an adherend, wherein the adhesive is adhered to film type electrodes of the film capacitor and that the adhesive force between the adhesive and the adherend is greater than the adhesive force between the insulation film of the film capacitor and the film type electrodes.

2. The information recording tag according to claim 1, wherein a spacer material is provided to the periphery of the film capacitor, an adhesive is adhered to the spacer material, and the adhesive force between the adhesive and the adherend is greater than the adhesive force between the adhesive and the spacer material.

3. The information recording tag of claim 2 wherein the film capacitor comprises a mica capacitor.

4. The information recording tag according to claim 1, wherein an adhesive is applied to the IC module while no spacer material is provided thereon.

5. The information recording tag of claim 4 wherein the film capacitor comprises a mica capacitor.

6. The information recording tag according to claim 1, wherein the adhesive force between the adhesive and the adherend is greater than the adhesive force between the, adhesive and the substrate.

7. The information recording tag of claim 6 wherein the film capacitor comprises a mica capacitor.

8. The information recording tag of claim 1 wherein the film capacitor comprises a mica capacitor.

* * * * *